(12) United States Patent
He et al.

(10) Patent No.: US 7,175,970 B2
(45) Date of Patent: Feb. 13, 2007

(54) MECHANICALLY ROBUST INTERCONNECT FOR LOW-K DIELECTRIC MATERIAL USING POST TREATMENT

(75) Inventors: Jun He, Portland, OR (US); Jihperng Leu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/286,783

(22) Filed: Nov. 22, 2005

(65) Prior Publication Data

US 2006/0073416 A1   Apr. 6, 2006

Related U.S. Application Data

(62) Division of application No. 10/253,723, filed on Sep. 24, 2002, now Pat. No. 6,998,216.

(51) Int. Cl.
  *G03C 5/00* (2006.01)
  *H01L 21/31* (2006.01)
(52) U.S. Cl. ............. 430/296; 430/942; 438/637; 257/758; 257/798
(58) Field of Classification Search ............. 430/296, 430/313–315, 317, 328, 942; 438/637, 702, 438/761, 763, 778, 782; 257/758, 798
See application file for complete search history.

(56) References Cited

U.S. PATENT DOCUMENTS 6,042,994 A * 3/2000 Yang et al. ............. 430/296
6,169,039 B1 * 1/2001 Lin et al. ................. 438/761

* cited by examiner

*Primary Examiner*—Christopher G. Young
(74) *Attorney, Agent, or Firm*—Blakely, Sokoloff, Taylor & Zafman LLP

(57) ABSTRACT

In an embodiment, a trench is formed above a via from a photo resist (PR) trench pattern in a dielectric layer. The trench is defined by two sidewall portions and base portions. The base portions of the sidewalls are locally treated by a post treatment using the PR trench pattern as mask to enhance mechanical strength of portions of the dielectric layer underneath the base portions. Seed and barrier layers are deposited on the trench and the via. The trench and via are filled with a metal layer. In another embodiment, a trench is formed from a PR trench pattern in a dielectric layer. A pillar PR is deposited and etched to define a pillar opening having a pillar surface. The pillar opening is locally treated on the pillar surface by a post treatment to enhance mechanical strength of portion of the dielectric layer underneath the pillar surface.

14 Claims, 12 Drawing Sheets

MECHANICALLY ROBUST INTERCONNECT FOR LOW-K DIELECTRIC MATERIAL USING POST TREATMENT

CROSS-REFERENCES TO RELATED APPLICATIONS

This is a Divisional Application of U.S. patent application Ser. No. 10/253,723, filed Sep. 24, 2002 now U.S. Pat. No. 6,998,216. This Divisional Application claims the benefit of the U.S. patent application Ser. No. 10/253,723.

BACKGROUND

1. Field of the Invention

Embodiments of the invention relates to the field of semiconductor, and more specifically, to semiconductor fabrication.

2. Description of Related Art

Low dielectric constant (low-k) materials are used in interlayer dielectrics (ILD) in semiconductor devices to reduce propagation delay and improve device performance. As device sizes continue to shrink, the dielectric constant of the material between the metal lines should decrease to maintain the improvement. The eventual limit for the dielectric constant is k=1, which is the value for vacuum. This can be achieved by producing a void space between the metal lines, effectively creating an air gap. Air itself has a dielectric constant very close to 1. As integrated circuit (IC) technology scales, there is an increasing need to integrate low-k dielectric or even air as ILD material in order to meet the performance targets. However, the consequence is the drastic deterioration of the ILD mechanical properties. The intrinsic and extrinsic stresses become more concentrated on the metal interconnects.

Existing techniques to enhance the mechanical robustness of interconnects have a number of drawbacks. One technique is to increase the via density. However, the electrical nature of the conducting vias severely limit the via density or device layout due to the potential shorting of adjacent circuitry. Another technique is to integrate strong dielectric materials, usually with higher k value, at the via level as discrete dielectric lines or as mechanical pillars. This technique increases the complexity of the fabrication process and introduces additional dielectric materials. In air gap techniques, new materials are necessary to enable the process.

BRIEF DESCRIPTION OF THE DRAWINGS

The invention may best be understood by referring to the following description and accompanying drawings that are used to illustrate embodiments of the invention. In the drawings.

DESCRIPTION

Figure 1:
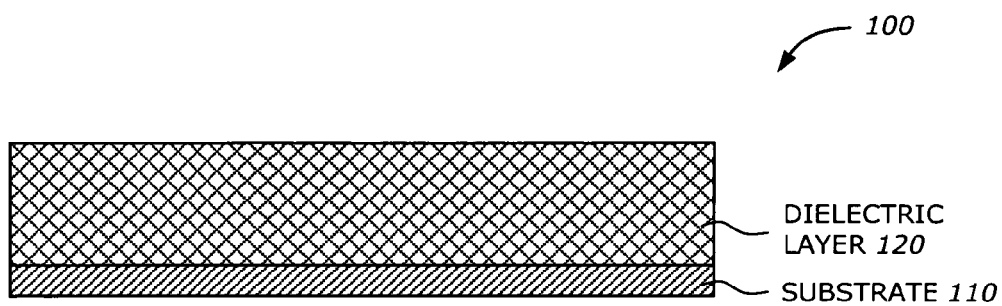
FIG. 1 is a diagram illustrating formation of dielectric layer according to one embodiment of the invention.

An embodiment of the present invention includes a method to strengthen interconnect structures. A first trench is formed above a first via from a first photo resist (PR) trench pattern in a first dielectric layer. The first trench is defined by two first sidewall portions and first base portions. The first base portions of the first sidewalls are locally treated by a post treatment using the first PR trench pattern as mask to enhance mechanical strength of portions of the first dielectric layer underneath the first base portions. First seed and barrier layers are deposited on the first trench and the first via. The first trench and the first via are filled with a first metal layer. The post treatment may be any suitable post treatment method such as electron beam (e-beam) radiation and plasma exposure. In another embodiment, a pillar is mechanically strengthened by a post treatment. A first trench is formed from a first photo resist (PR) trench pattern in a first dielectric layer. A first pillar PR is deposited and etched to define a first pillar opening having a first pillar surface. A first pillar opening on the first pillar surface is locally treated by a post treatment using the etched first pillar PR as mask to enhance mechanical strength of portion of the first dielectric layer underneath the first pillar surface. First seed and barrier layers are deposited on the first trench. The first trench is then filled with a first metal layer.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

The invention is a technique to provide mechanically robust interconnect architecture in a semiconductor device. The technique enables the use of weak or low-k dielectric materials or even air gap to enhance device performance such as reducing delays. The technique uses a post cure treatment process to enhance the mechanical strength. In the following description, although e-beam radiation is referred to, it is contemplated that any other post treatment method may be used. The interconnection system thus fabricated may sustain the integration process and the assembly environment by having reinforced interlevel dielectric (ILD) pillars or trenches without introduction of new ILD materials.

There are essentially two approaches. In the first approach, the portions in the dielectric layer underneath the trench and around the via are reinforced by e-beam radiation. In this approach, no new mask is required. In the second approach, a mechanical pillar is created or formed by exposing a strategically selected trench to e-beam radiation. In this approach, a new mask is needed to define the mechanical pillar. The first approach is described by the stages of fabrication shown in FIG. 1 through FIG. 9 and the flow charts in FIGS. 17 and 18. The second approach is described by the stages of fabrication shown in FIGS. 1–2 and 10–16, and the flow charts in FIGS. 19 and 20. In the process stages described in the following, for illustrative purposes, the description is based on the via first (i.e., from via then trench) dual damascene process. It is contemplated that the same technique and/or concept can be extended to other dual damascene processes, such as treating via and trench as separate layers, each with its own pattern, chemical mechanical polishing (CMP), and etch stop.

FIG. 1 is a diagram illustrating formation 100 of a dielectric layer according to one embodiment of the invention. A dielectric layer 120 is deposited on a substrate 110. The substrate 110 is a structure formed by a wafer substrate such as silicon, gallium, arsenide (GaAs), or a composition containing silicon (e.g., crystalline silicon, polysilicon, amorphous silicon, epitaxial silicon, silicon oxide). The dielectric layer 120 is made by a low-k dielectric material such as carbon-doped oxide (CDO), Methylsilsesquioxanes (MSSQ), Nanoglass E (Nanoglass is a registered trademark by Honeywell), silsesquioxane polymer, siloxane polymer, polyarylene ether, and polymeric dielectric materials. These low-k materials, especially CDO and MSSQ, when cured by e-beam, have shown two times improvement in mechanical strength at 75 μcoulomb dosage with insignificant increase in dielectric constant. The dielectric layer 120 may be deposited on the substrate 110 using conventional techniques such as spin coating, dip coating, spraying coating, Chemical Vapor Deposition (CVD), and Plasma Enhanced CVD (PECVD).

Figure 2:
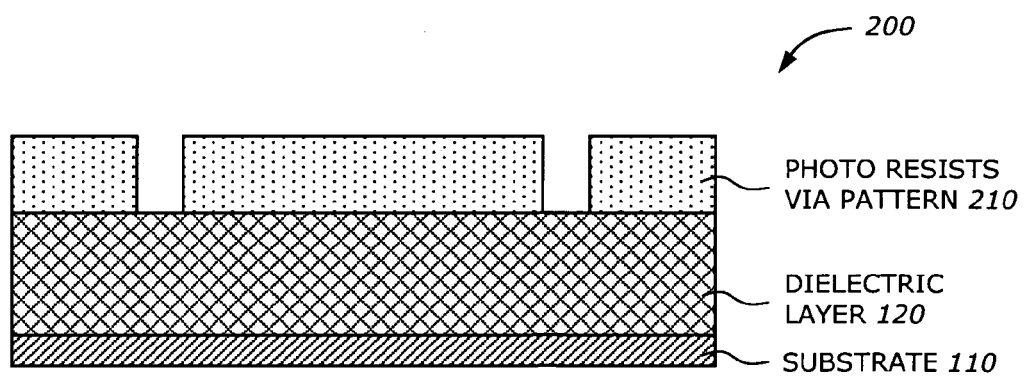
FIG. 2 is a diagram illustrating a structure formed by patterning via photo resist according to one embodiment of the invention.

FIG. 2 is a diagram illustrating a structure 200 formed by patterning via photo resist according to one embodiment of the invention. A photo resist (PR) layer 130 is deposited on the dielectric layer 120 and is patterned for via holes.

Figure 3:
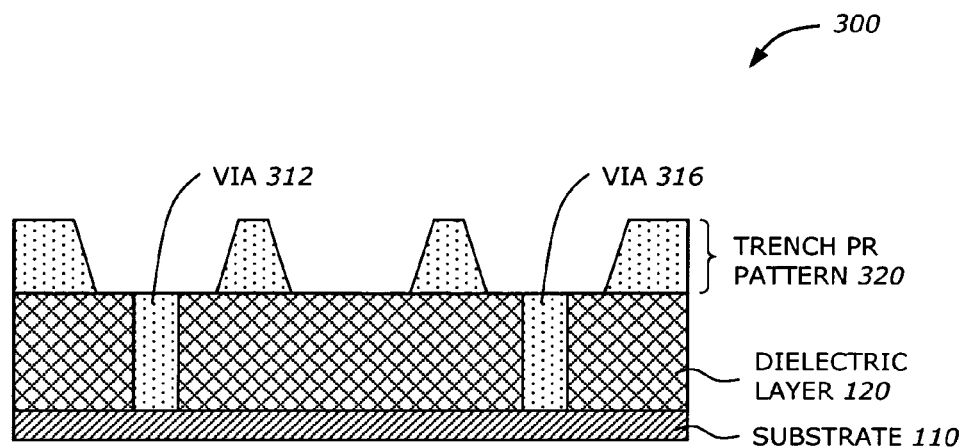
FIG. 3 is a diagram illustrating a structure formed by etching vias and patterning trench photo resist according to one embodiment of the invention.

FIG. 3 is a diagram illustrating a structure 300 formed by etching vias and patterning trench photo resist according to one embodiment of the invention. Via holes 312 and 314 are etched using the via PR to go through the dielectric layer 120. A trench PR is then deposited and patterned for trenches to form a trench PR pattern layer 320.

Figure 4:
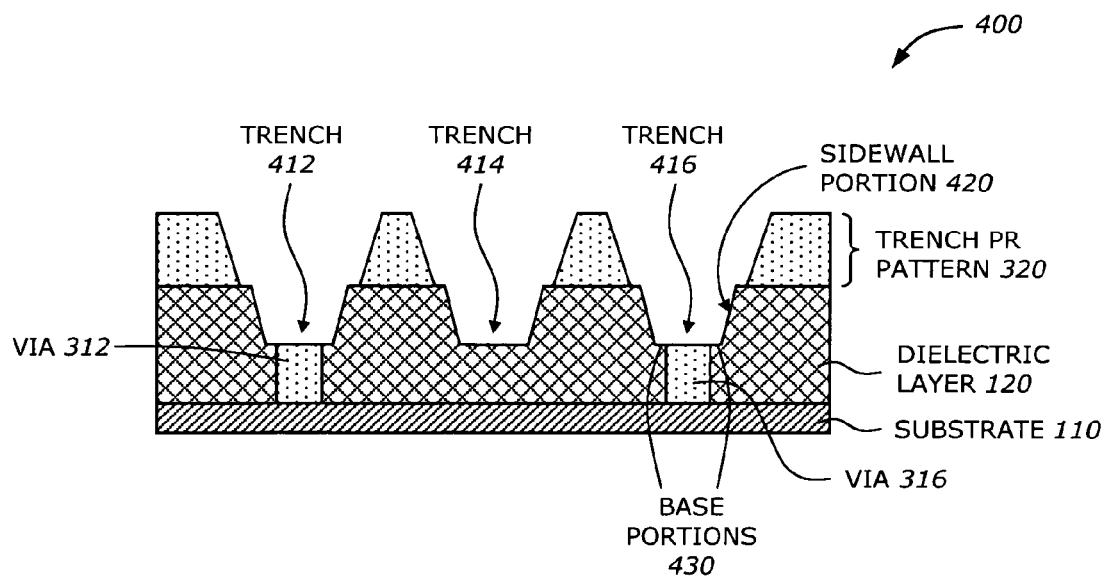
FIG. 4 is a diagram illustrating a structure formed by etching trench according to one embodiment of the invention.

FIG. 4 is a diagram illustrating a structure 400 formed by trench etching according to one embodiment of the invention. Trenches or grooves 412, 414, and 416 are then etched using the trench PR pattern 320. Trenches 412 and 416 are examples of trenches that are above vias. Trench 414 is etched without a via beneath it. Trenches 412 and 414 are defined by two sidewalls 420 and base portions or surfaces 430. The base portions 430 are on both sides of the via area. The sidewall portions 420 are slanted or upright and the base portions 430 are approximately horizontal.

Figure 5:
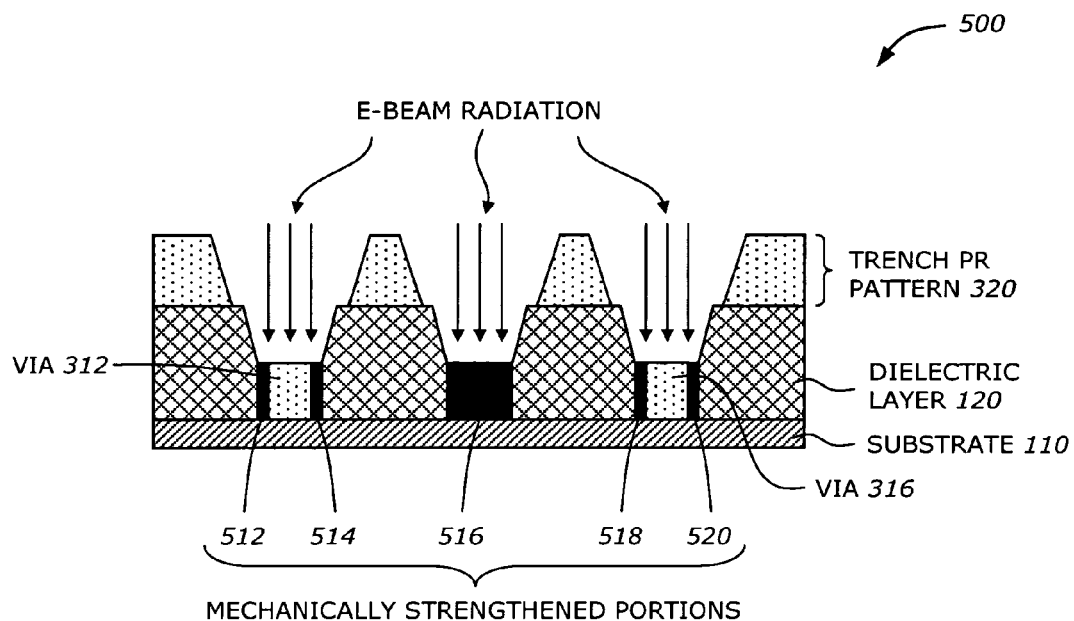
FIG. 5 is a diagram illustrating a structure formed by irradiating by e-beam according to one embodiment of the invention.

FIG. 5 is a diagram illustrating a structure 500 formed by irradiating by e-beam according to one embodiment of the invention. The structure 400 is subject to e-beam post cure treatment to enhance the mechanical strength of the portions of the dielectric layer 120 under the radiation area. The post cure treatment also converts the chemical structure to more cross-linked Si—C—Si structure, which has different dry/wet etch behavior than those as-deposited Nanoglass E. The selectivity between as-deposited and post e-beam treated increases significantly if the e-beam dose increases to convert the Nanoglass to a much stronger dielectric such as silicon oxide. The trenches 412, 414, and 416 are irradiated locally by e-beam with appropriate dosage. The dosage of the e-beam radiation is adjusted to achieve the desired mechanical strength and/or etch selectivity for the portions of the dielectric layer 120 underneath the base portions 430. Typically, the dosage and energy selected are proportional to the thickness of the dielectric layer 120. Exposure time may range from a few minutes to two hours. The dosage may range from 500 μcoulombs/cm$^2$ to 20,000 μcoulombs/cm$^2$. The accelerating voltage may range from approximately 0.5 KeV to 20 KeV. The e-beam radiation may also be performed in presence of a gas such as hydrogen, helium, argon, nitrogen, oxygen, xenon, or any of their mixtures.

After e-beam post cure treatment, the portions or regions 512, 514, 516, 518, and 529 of the dielectric layer 120 below the base portions 430 are mechanically strengthened to provide stable and strong support for the multilayer interconnects. The portions 512 and 514 are those below the trench 412 and adjacent to or surrounding the via 312. The portion 516 is the portion below the trench 414. The portions 518 and 520 are those below the trench 416 and adjacent to or surrounding the via 316. Although e-beam radiation is a preferred method, other post cure treatment techniques may be employed. Examples include thermal curing and plasma exposure, used with or without e-beam radiation.

Figure 6:
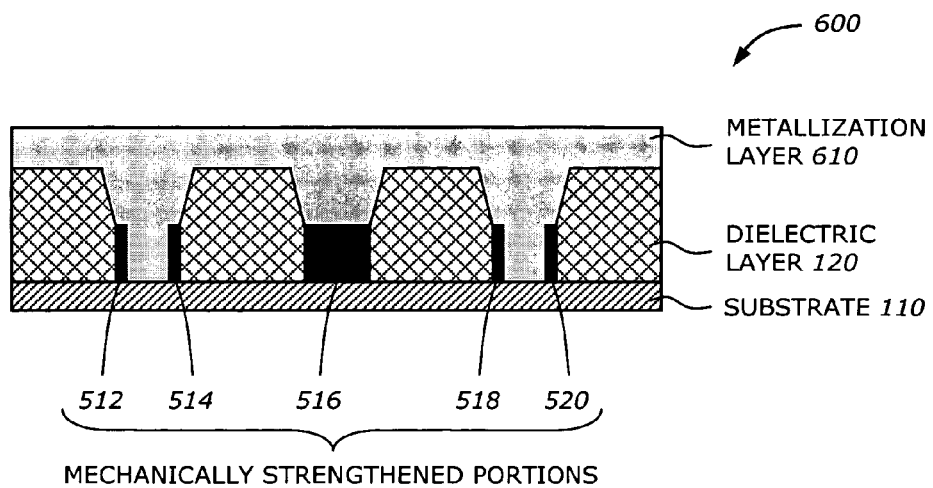
FIG. 6 is a diagram illustrating a structure formed by metallization layer according to one embodiment of the invention.

FIG. 6 is a diagram illustrating a structure 600 formed by forming metallization layer according to one embodiment of the invention. After post cure treatment, seed and barrier layers are deposited and metal is filled or deposited into the trenches 412, 414, and 416 and vias 312 and 314 to form a metallization layer 610. The metallization layer 610 may be formed as a single layer or a multilayer structure. A single layer may be formed using a material selected from a group including aluminum (Al) alloy, copper (Cu) alloy, pure copper, and tungsten. A multilayer structure may have a barrier layer or a wetting layer below the primary layer of Al alloy, Cu alloy, pure copper, or tungsten. The multilayer structure may be Ti/TiN/Al—Cu, Ti/Al—Cu (when the primary layer is Al) or Ti/TiN/Cu, Ta/TaN/Cu (when the primary layer is Cu). The metallization layer 610 may be formed using standard techniques such as chemical vapor deposition (CVP), plating, sputtering, vapor deposition, and coating.

Figure 7:
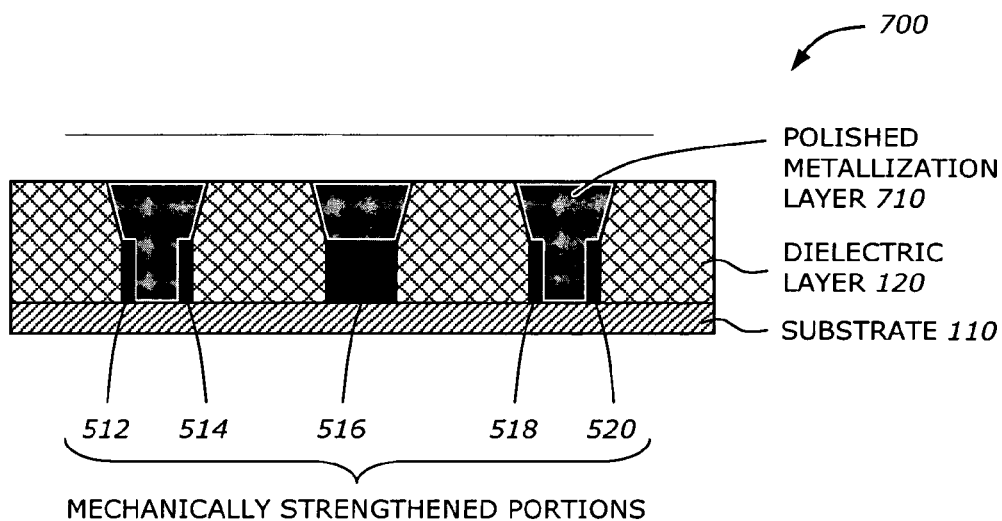
FIG. 7 is a diagram illustrating a structure formed by polishing metallization layer according to one embodiment of the invention.

FIG. 7 is a diagram illustrating a structure 700 formed by polishing metallization layer according to one embodiment of the invention. The metallization layer 610 is polished and planarized using polishing techniques such as chemical mechanical polishing (CMP), dry etch back, or wet removal. The structure 700 thus formed may be referred to as a dual damascene structure. The process as shown from FIG. 1 through FIG. 7 can then be repeated for additional layer(s). For subsequent layers, the substrate 110 shown in FIG. 1 may be replaced by the dual damascene 700.

Figure 8:
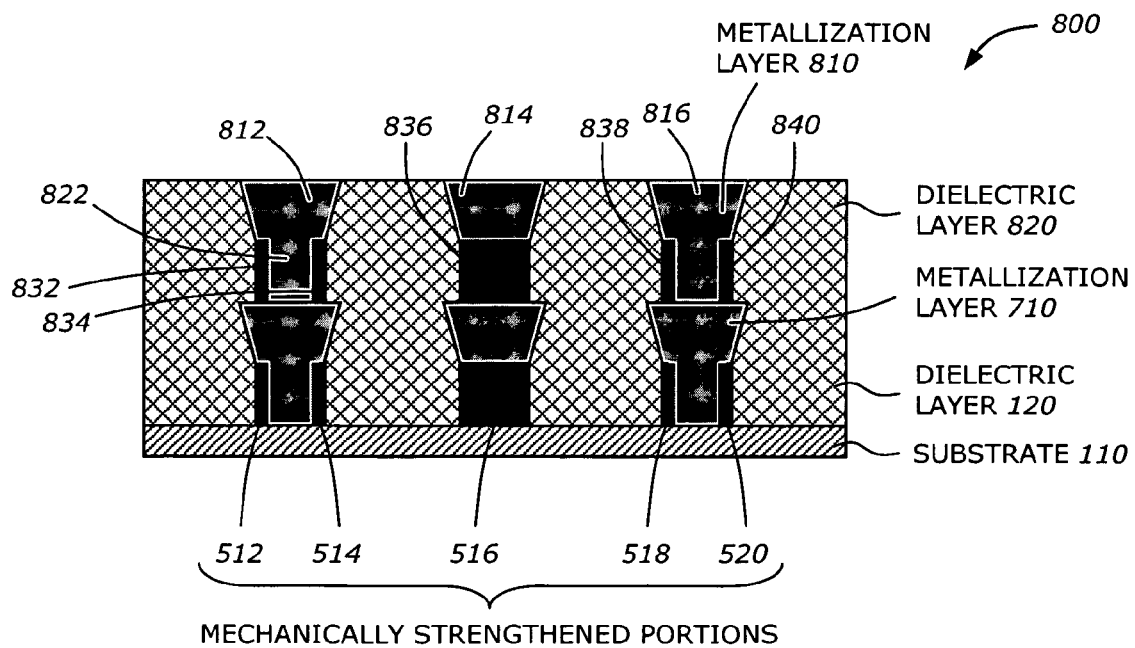
FIG. 8 is a diagram illustrating a structure formed by second interconnect level according to one embodiment of the invention.

FIG. 8 is a diagram illustrating a structure 800 formed by second interconnect level according to one embodiment of the invention. The structure 800 shows two levels of interconnects. The second level is built upon the first level or the first dual damascene structure shown in FIG. 7. The first dual damascene may or may not have the mechanically strong portions. The structure 800 thus includes additionally a dielectric layer 820 and a metallization layer 810. The structure 800 has trenches 812, 814, and 816, and vias 822 and 826. Portions 832, 834, 836, 838, and 840 of the dielectric layer 820 are below the trenches 812, 814, and 816. The portions 832 and 834 are adjacent to or surround the via 822. The portions 838 and 840 are adjacent to or surround the via 826.

The structure 800 therefore has a mechanically robust or strong multilayer interconnects due to the strong support of the mechanically strengthened portions 512, 514, 516, 518, 520, 832, 834, 836, 838, and 840 of the dielectric layer 820. These portions are made mechanically robust by a local post treatment such as an e-beam radiation at appropriate dosage.

Figure 9:
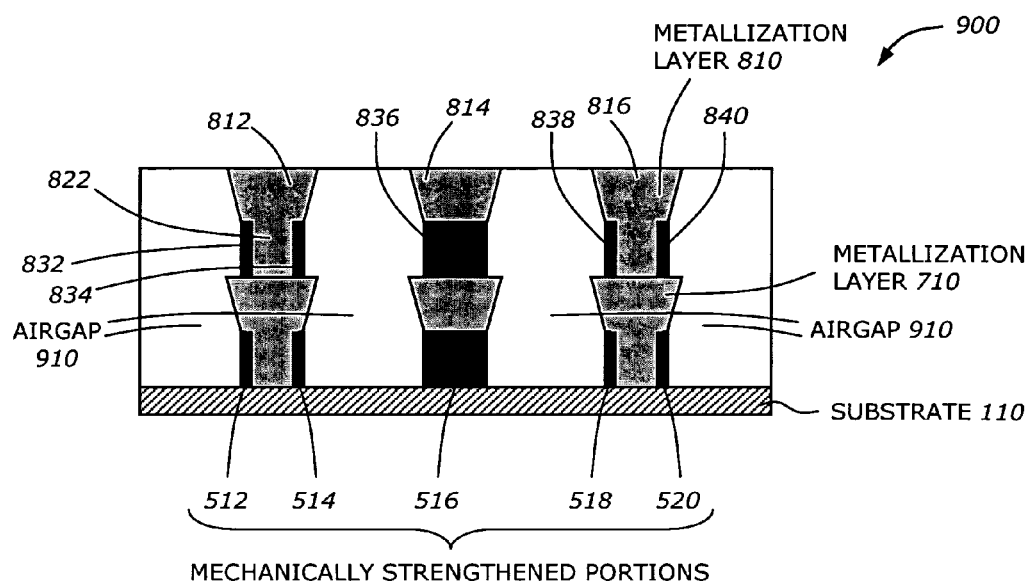
FIG. 9 is a diagram illustrating a structure formed by formation of an air gap according to one embodiment of the invention.

FIG. 9 is a diagram illustrating a structure 900 formed by formation of an air gap according to one embodiment of the invention. A protecting layer (e.g., Co shunt) may be used to protect the top surface of all metal lines (e.g., the metallization layers 710 and 810) from chemical attack during various processes and use conditions (e.g., oxidation from ambient). The non-treated portions of the dielectric layers 120 and 820 are etched away to form an air gap. A no etch stop process may be needed to enable the wet etch operation at the end of the process. If no etch stop is present, a protective layer is needed.

The structure 800 represents a semiconductor device that includes a metallization layer on a substrate or a dual damascene structure. The metallization layer includes metal filled into a trench and a via. The trench is above the via and is defined by two sidewall portions and base portions. A dielectric layer surrounds the metallization layer. The dielectric layer has portions underneath the base portions that are mechanically strengthened by a post treatment such as e-beam radiation. The structure 900 is similar to the structure 800 except that there is an air gap surrounding the metallization layer and the mechanically strengthened portions of the dielectric layer.

Another embodiment of the invention when vias are not formed is the use of mechanical pillars. The process to fabricate a multilevel interconnect system using the mechanical pillars is similar to the process shown from FIG. 1 through FIG. 8 except that a pillar photo resist layer is needed. The first two stages of this process are similar to stages shown in FIGS. 1 and 2.

Figure 10:
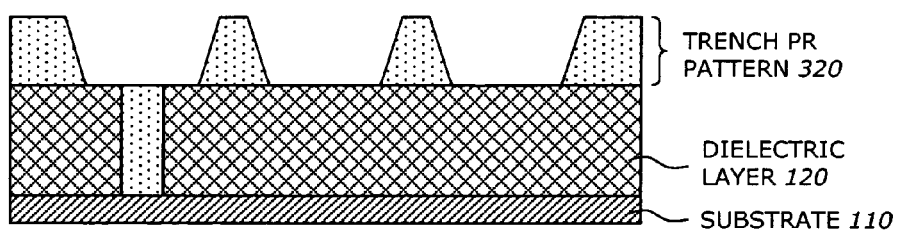
FIG. 10 is a diagram illustrating a structure formed by etching vias and patterning trench photo resist for mechanical pillars according to one embodiment of the invention.

FIG. 10 is a diagram illustrating a structure 1000 formed by etching vias and patterning trench photo resist for mechanical pillars according to one embodiment of the invention. After the two stages shown in FIGS. 1 and 2, the via etching and PR trench patterning are performed.

Figure 11:
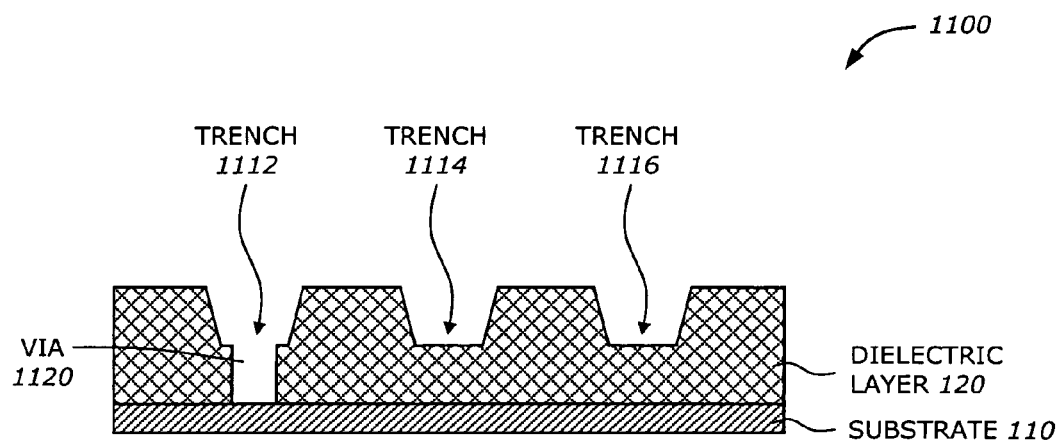
FIG. 11 is a diagram illustrating a structure formed by etching trench according to one embodiment of the invention.

FIG. 11 is a diagram illustrating a structure 1100 formed by etching trench according to one embodiment of the invention. The structure 1100 includes via 1120, trenches 1112, 1114, and 1116. The trench 1112 is above the via 1120. In this illustrative example, the trench 1112 and 1114 do not need mechanically strong portions.

Figure 12:
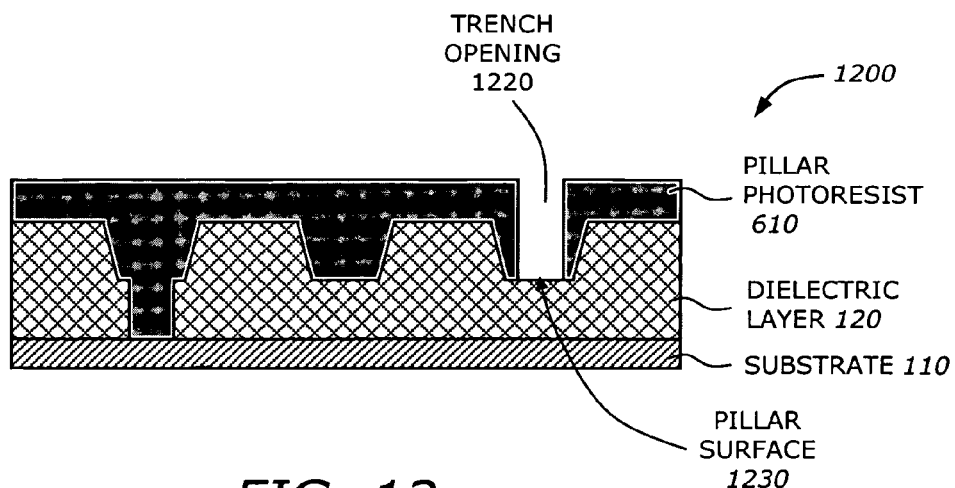
FIG. 12 is a diagram illustrating a structure formed by defining mechanical pillars by photo resist according to one embodiment of the invention.

FIG. 12 is a diagram illustrating a structure 1200 formed by defining mechanical pillars by photo resist according to one embodiment of the invention. A pillar photo resist layer 1210 is deposited on the trenches 1112, 1114, and 1116. For illustrative purposes, the trench 116 is the one that needs a mechanical pillar to strengthen the support for the multilayer interconnect. The pillar PR is etched to form a trench opening 1220. The trench opening 1220 has a pillar surface 1230.

Figure 13:
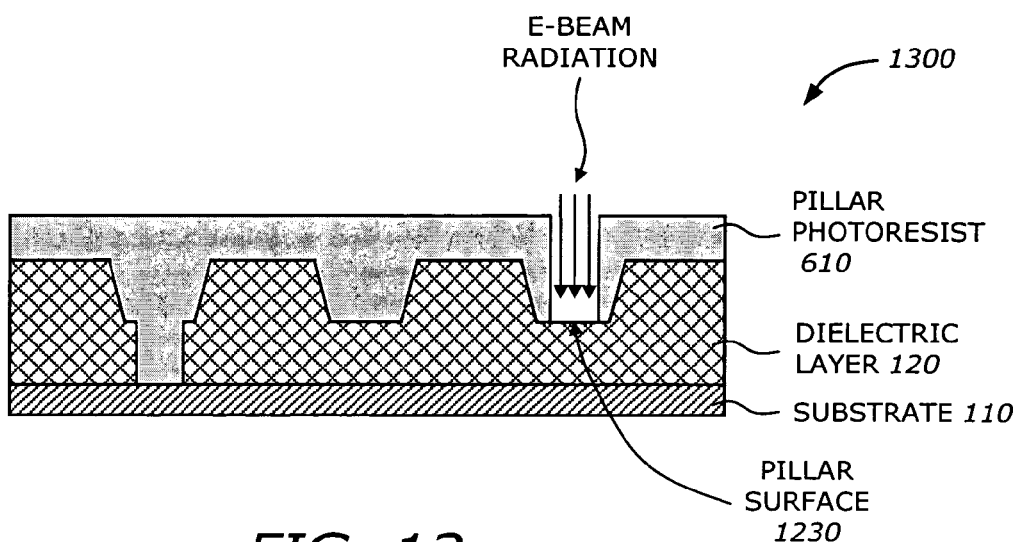
FIG. 13 is a diagram illustrating a structure formed by irradiating pillar surface by e-beam according to one embodiment of the invention.

FIG. 13 is a diagram illustrating a structure 1300 formed by irradiating pillar surface by e-beam according to one embodiment of the invention. The structure 1300 is subject to e-beam post cure treatment. The pillar surface 1230 is irradiated locally by e-beam as discussed above. The e-beam dosage may be adjusted to provide desired mechanical strength and selectivity. Any other post treatment techniques may be used such as local heat treatment and plasma exposure.

Figure 14:
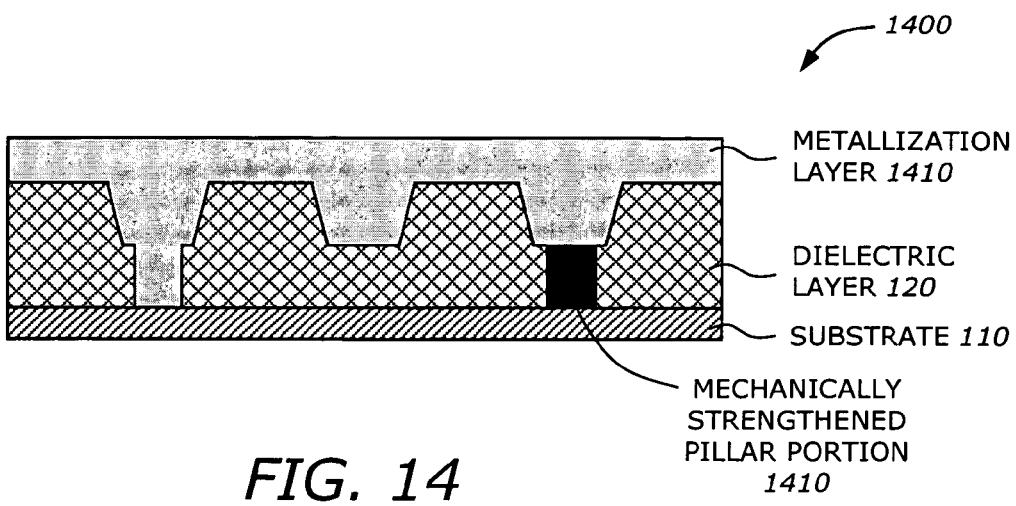
FIG. 14 is a diagram illustrating a structure formed by forming metallization layer according to one embodiment of the invention.

FIG. 14 is a diagram illustrating a structure 1400 formed by forming a metallization layer according to one embodiment of the invention. After e-beam irradiation, a pillar portion 1410 is formed underneath the pillar surface 1230.

To form additional interconnect level, the process shown in FIGS. 1, 2, 10, 11, 12, 13, and 14 may be repeated except that the substrate 110 may be replaced by a dual damascene structure. The dual damascene structure may or may not have mechanically strong portions of the dielectric layer.

Figure 15:
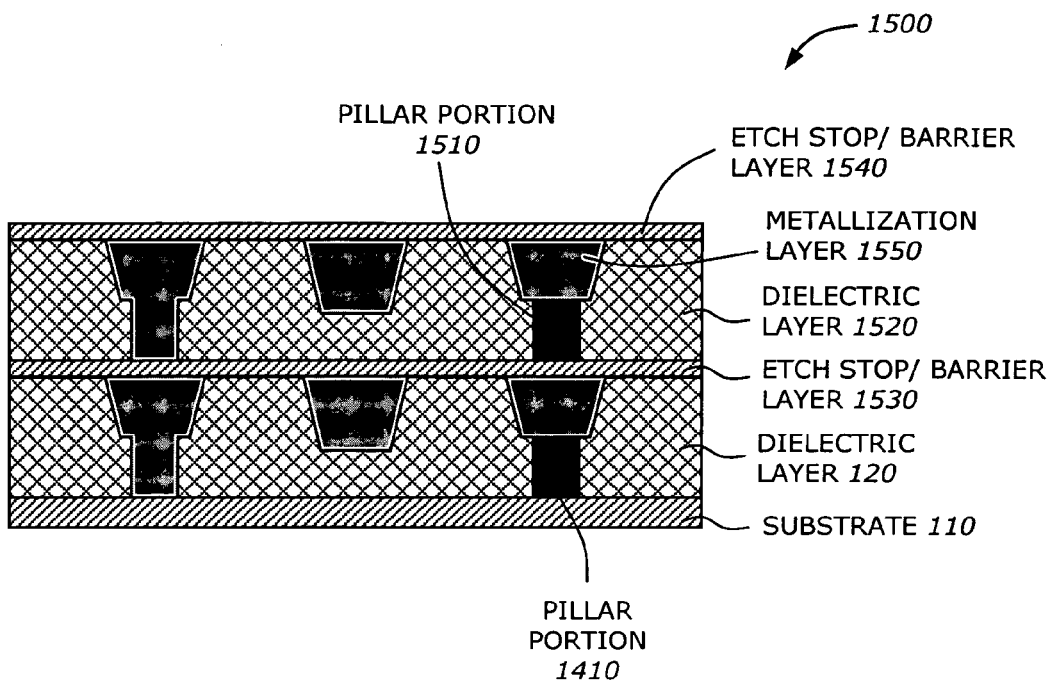
FIG. 15 is a diagram illustrating a structure formed by second interconnect level according to one embodiment of the invention.

FIG. 15 is a diagram illustrating a structure 1500 formed by second interconnect level according to one embodiment of the invention. The structure 1500 includes additionally a pillar portion 1510, dielectric layer 1530, etch stop/barrier layers 1530 and 1540, and metallization layer 1550. The layers 1530 and 1540 are primarily etch stop layers and can serve as copper diffusion barriers to the ILD. The pillar portion 1510 is made mechanically strong or stable after post cure treatment such as e-beam radiation with appropriate dosage.

Figure 16:
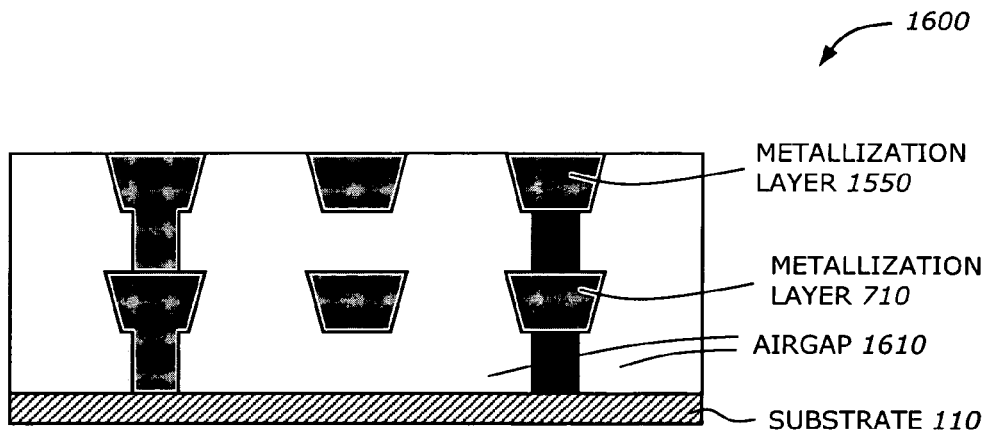
FIG. 16 is a diagram illustrating a structure formed by formation of an air gap for mechanical pillar technique according to one embodiment of the invention.

FIG. 16 is a diagram illustrating a structure 1600 formed by formation of an air gap for mechanical pillar technique according to one embodiment of the invention. The top surface of every metal line, or level, is protected by a protecting layer (e.g., Co shunt). The non-treated dielectrics in the dielectric layers 120 and 1520 are etched away to form an air gap 1610. A no etch stop process may be needed to enable the wet etch operation at the end of the process. The structure 1600, therefore, includes a mechanically robust multilayer interconnects with mechanical pillars strengthened by a post cure treatment such as e-beam radiation.

The structure 1500 represents a semiconductor device including a metallization layer and a dielectric layer. The metallization layer is on a substrate or a dual damascene structure. The metallization layer includes metal filled into a trench defined by two sidewall portions and a pillar surface. The dielectric layer surrounds the metallization layer. The dielectric layer has a pillar portion underneath the pillar surface. The pillar portion is mechanically strengthened by a post cure treatment process such as an e-beam radiation.

Figure 17:
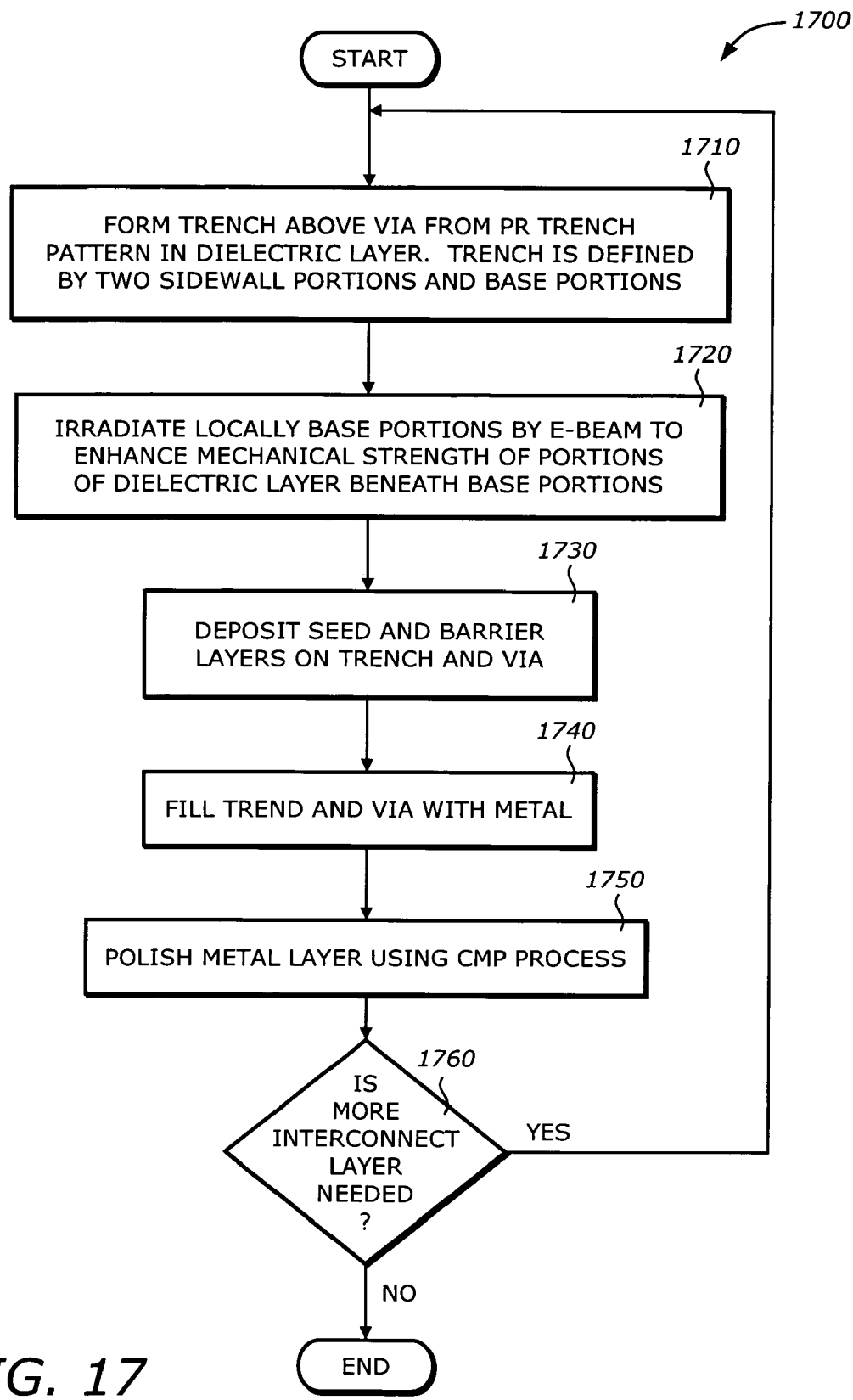
FIG. 17 is a flowchart illustrating a process to strengthen portions underneath base portions of trench and adjacent to via according to one embodiment of the invention.

FIG. 17 is a flowchart illustrating a process 1700 to strengthen portions underneath base portions of trench and adjacent to via according to one embodiment of the invention.

Upon START, the process 1700 forms trench or trenches above via or vias from a PR trench pattern in a dielectric layer (Block 1710). The trench is defined by two sidewalls and base portions surrounding the vias. Next, the process 1700 irradiates locally the base portions by e-beam to enhance the mechanical strength of the portions of dielectric layer underneath the base portions (Block 1720).

Then, the process 1700 deposits seed and barrier layers on the trench or trenches and via or vias (Block 1730). Next, the process 1700 fills the trench or trenches and via or vias with metal to form a metallization layer (Block 1740). Then, the process 1700 polishes and planarizes the metallization layer using a CMP process (Block 1750). Next, the process 1700 determines if more interconnect layer is needed (Block 1760). If so, the process 1700 returns to Block 1710 to build the next layer on the current layer. Otherwise, the process 1700 is terminated.

Figure 18:
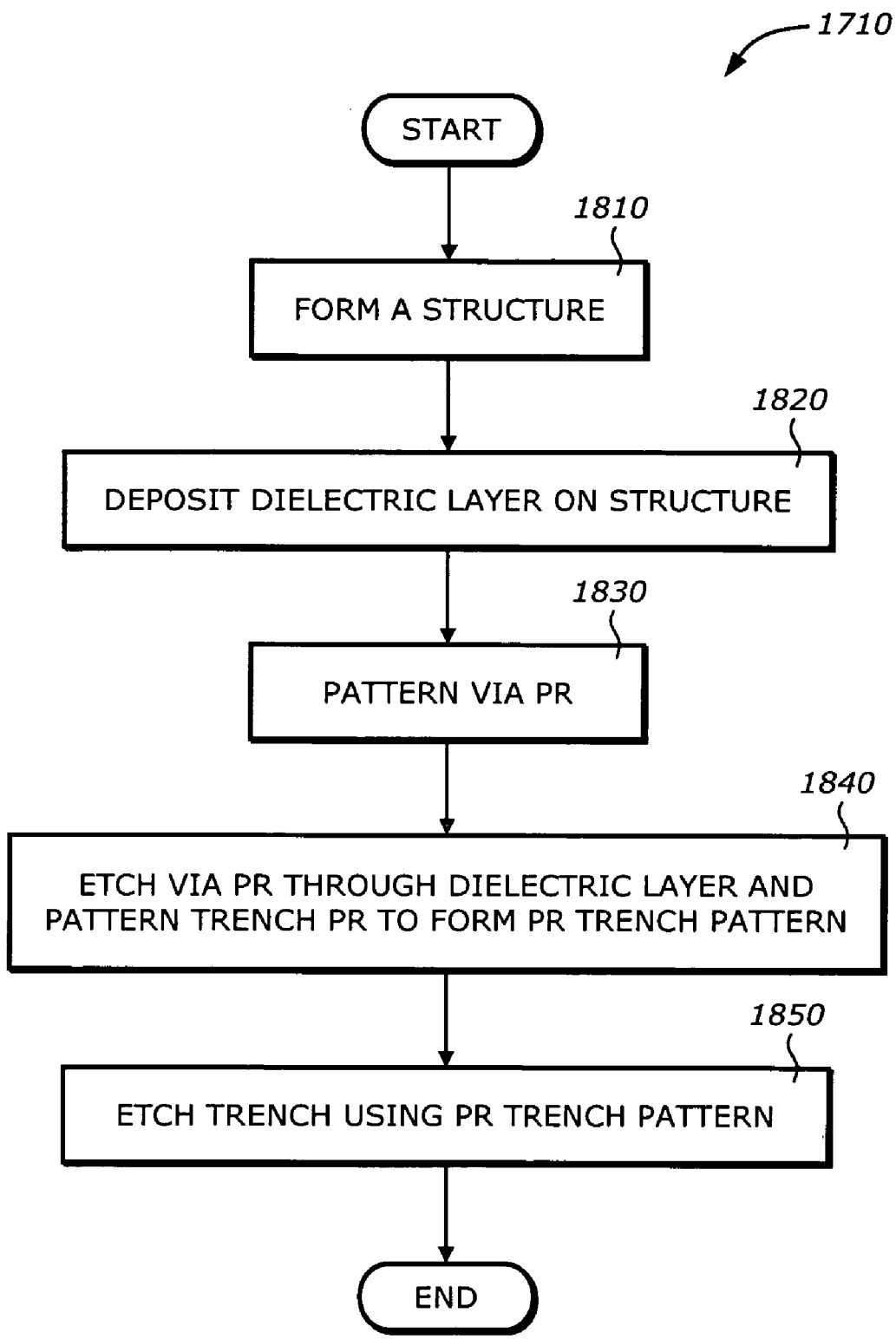
FIG. 18 is a flowchart illustrating a process to form trench above via according to one embodiment of the invention.

FIG. 18 is a flowchart illustrating the process 1710 to form trench above via according to one embodiment of the invention.

Upon START, the process 1710 forms a structure (Block 1810). If this is the first layer, the structure is the substrate. If this is the subsequent layer, the structure is a dual damascene structure that has been constructed before. Note that the previous dual damascene structure may or may not have the mechanically strengthened portions. Next, the process 1710 deposits the dielectric layer on the structure (Block 1820). Then, the process 1710 patterns a via PR (Block 1830).

Next, the process 1710 etches the via PR to form via or vias through the dielectric layer and patterns the trench PR to form a PR trench pattern (Block 1840). Then, the process 1710 etches the trench or trenches using the PR trench pattern as mask (Block 1850). The process 1710 is then terminated.

Figure 19:
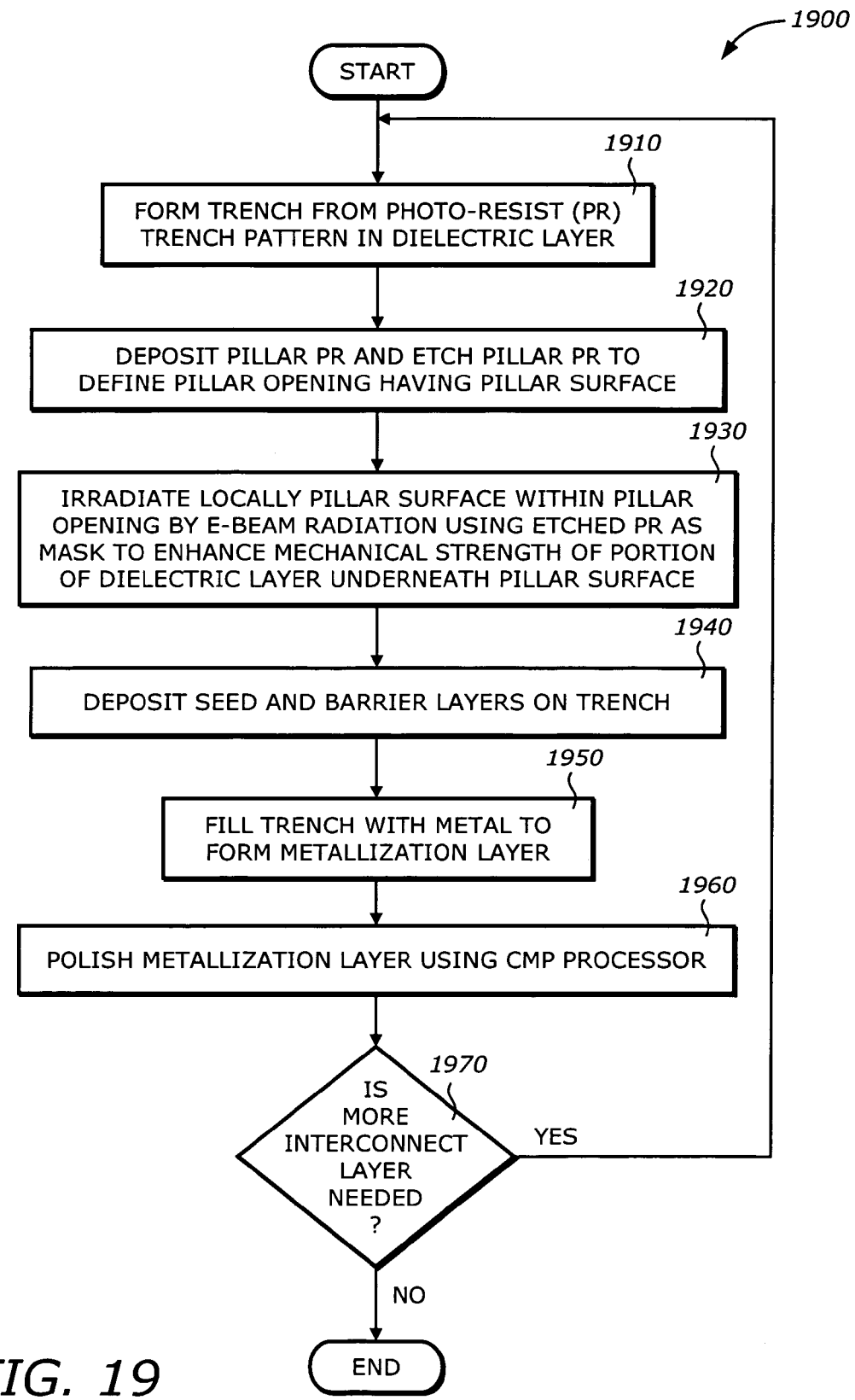
FIG. 19 is a flowchart illustrating a process to form mechanical pillars according to one embodiment of the invention.

FIG. 19 is a flowchart illustrating a process 1900 to form mechanical pillars according to one embodiment of the invention.

Upon START, the process 1900 forms trench or trenches from a PR trench pattern in a dielectric layer (Block 1910). Next, the process 1900 deposits a pillar PR and etches the pillar PR to define a pillar opening having a pillar surface (Block 1920). The pillar opening is typically is at a trench that needs strengthened mechanical support. The pillar opening is confined to localize the e-beam radiation to the pillar surface.

Then, the process 1900 irradiates locally the pillar surface within the pillar opening by e-beam radiation using the etched pillar PR as mask to enhance the mechanical strength of the portion of the dielectric layer underneath the pillar surface (Block 1930). The dosage of the e-beam radiation is selected to provide suitable mechanical strength and etch selectivity. Next, the process 1900 deposits seed and barrier layers on the trench or trenches (Block 1940). Then, the process 1900 fills the trench or trenches with metal to form a metallization layer (Block 1950). Next, the process 1900 polishes and planarizes the metallization layer using a CMP process (Block 1960).

Then, the process 1900 determines if more interconnect layer is needed (Block 1970). If so, the process 1900 returns to Block 1910 to build the next layer on the current structure. Otherwise, the process 1910 is terminated.

Figure 20:
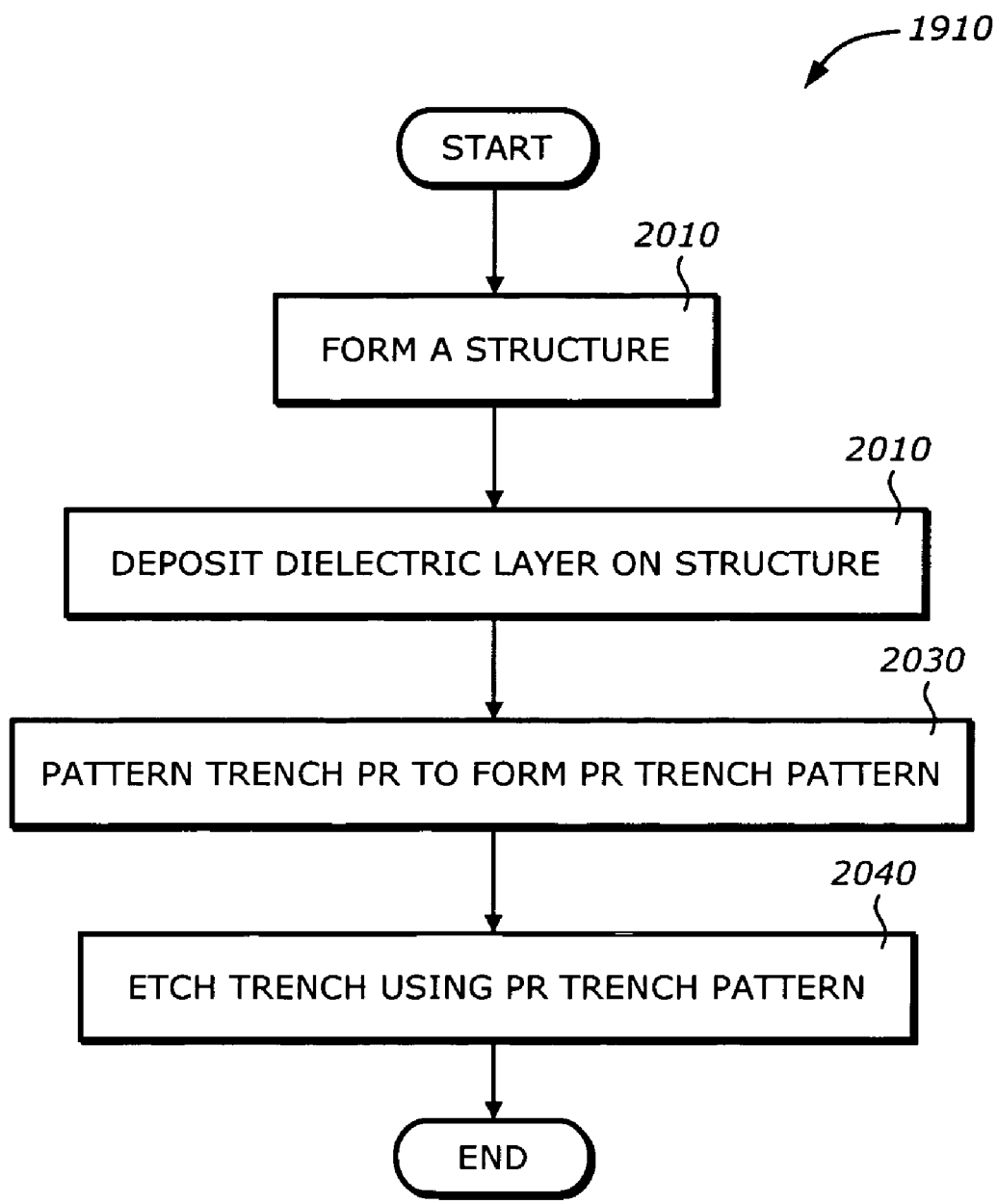
FIG. 20 is a flowchart illustrating a process to form trench for mechanical pillars according to one embodiment of the invention.

FIG. 20 is a flowchart illustrating the process 1910 to form trench for mechanical pillars according to one embodiment of the invention.

Upon START, the process 1910 forms a structure (Block 2010). If this is the first layer, the structure is the substrate. If this is the subsequent layer, the structure is a dual damascene structure that has been constructed before. Note that the previous dual damascene structure may or may not have the mechanically strengthened portions. Next, the process 1710 deposits the dielectric layer on the structure (Block 2020). Then, the process 1910 patterns a trench PR to form a trench PR pattern (Block 2030). Next, the process 1910 etches the trench or trenches using the PR trench pattern as mask (Block 2040). The process 1910 is then terminated.

Therefore, the technique uses localized post-cure treatment (e.g., e-beam radiation) to form strong ILD pillars by enhancing mechanical properties of the dielectric. The post-cure treatment may also significantly alter the dry/wet behavior of treated ILD pillars due to cross-linking, and therefore enable air gap formation. This technique provides an alternative to form air gap if needed. No new ILD materials are required to form reinforced pillar. The mechanical properties of the ILD at strategic locations are enhanced through various currently available post-cure treatments to create a metal interconnect system reinforced by strong ILD pillars or trenches. There are no new masks in the case of the reinforced trenches. For the mechanical pillar approach, there is a need of an additional mask at each metal level to define the mechanical pillars.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A device comprising:
   a first metallization layer on a structure, the first metallization layer including metal filled into a first trench and a first via, the first trench being above the first via and being defined by two first sidewall portions and first base portions; and
   a first dielectric layer surrounding the first metallization layer, the first dielectric layer having portions underneath the first base portions being mechanically strengthened by a post treatment.

2. The device of claim 1 further comprising:
   an air gap surrounding the first metallization layer and the mechanically strengthened portions of the first dielectric layer.

3. The device of claim 1 wherein the structure is a substrate.

4. The device of claim 1 wherein the structure is a dual damascene structure.

5. The device of claim 4 wherein the dual damascene structure comprises:
- a second metallization layer on a substrate, the second metallization layer including metal filled into a second trench and a second via, the second trench being above the second via and being defined by two second sidewalls having second sidewall portions and second base portions; and
- a second dielectric layer surrounding the second metallization layer, the second dielectric layer having portions underneath the second base portions being mechanically strengthened by the post treatment.

6. The device of claim 5 further comprising:
an air gap surrounding the first and second metallization layers and the mechanically strengthened portions of the first and second dielectric layers.

7. The device of claim 1 wherein the post treatment is one of an electron beam (e-beam) radiation, a local heat treatment, and a plasma exposure.

8. A device comprising:
- a first metallization layer on a structure, the first metallization layer including metal filled into a first trench, the first trench being defined by two first sidewall potions and a first pillar surface; and
- a first dielectric layer surrounding the first metallization layer, the first dielectric layer having a first pillar portion underneath the first pillar surface being mechanically strengthened by a post treatment.

9. The device of claim 8 further comprising:
an air gap surrounding the first metallization layer and the mechanically strengthened first pillar portion.

10. The device of claim 8 wherein the structure is a substrate.

11. The device of claim 8 wherein the structure is a dual damascene structure.

12. The device of claim 8 wherein the dual damascene structure comprises:
- a second metallization layer on a substrate, the second metallization layer including metal filled into a second trench, the second trench being defined by two second sidewalls having second sidewall portions and a second pillar surface; and
- a second dielectric layer surrounding the second metallization layer, the second dielectric layer having a second pillar portion underneath the second pillar surface being mechanically strengthened by the post treatment.

13. The device of claim 12 further comprising:
an air gap surrounding the first and second metallization layers and the mechanically strengthened first and second pillar portions.

14. The device of claim 8 wherein the post treatment is one of an electron beam (e-beam) radiation, a local heat treatment, and a plasma exposure.

* * * * *